United States Patent [19]

Wagoner et al.

[11] Patent Number: 5,038,458

[45] Date of Patent: Aug. 13, 1991

[54] METHOD OF MANUFACTURE OF A NONUNIFORM HEATING ELEMENT

[75] Inventors: Mervin W. Wagoner, North Webster; Steven M. Nimtz, Kimmel, both of Ind.

[73] Assignee: Heaters Engineering, Inc., North Webster, Ind.

[21] Appl. No.: 314,971

[22] Filed: Feb. 22, 1989

[51] Int. Cl.[5] .......... H05B 3/00; G01R 27/00

[52] U.S. Cl. .......... 29/593; 29/611; 29/621; 57/18; 219/549

[58] Field of Search .......... 29/610.1, 611, 612, 29/621, 623, 593; 57/16-18, 310, 352; 219/541, 548, 549; 338/212, 214, 218, 270, 302

[56] References Cited

U.S. PATENT DOCUMENTS

| | | | |
|---|---|---|---|
| 1,600,826 | 9/1926 | Langos | 57/18 |
| 1,855,876 | 4/1932 | Barker | 57/18 |
| 2,053,933 | 9/1936 | Abbott | 338/270 |
| 2,247,869 | 7/1941 | Beers | 338/302 |
| 3,280,452 | 10/1966 | Merritt | 29/610.1 |
| 3,493,017 | 2/1970 | Govaery | 57/18 |
| 3,512,350 | 5/1970 | Lukas | 57/18 |
| 3,724,190 | 4/1973 | Balbatun et al. | 57/18 |

*Primary Examiner*—P. W. Echols

*Attorney, Agent, or Firm*—Roger M. Rickert

[57] ABSTRACT

A flexible elongated resistance heating element of improved uniformity and ease of termination has a continuous strip of resistance wire formed about a flexible elongated strand of insulating material in a generally helical pattern of nonuniform pitch with regions of increased pitch and correspondingly reduced turns density which regions experience little increase in temperature when the element is energized. The pitch of the helical resistance wire pattern varies as it approaches each of the ends of the element to provide a region of increased pitch followed by a region of decreased pitch at each end. Shorting wires may thereby be eliminated. An insulating coating surrounds the resistance wire and strand and electrical terminals are connected by crimping to the regions of decreased pitch of the resistance wire at the ends. The heating element may be bonded to a support member in a serpentine pattern with the cool end regions extending freely from the support member. Intermediate regions of increased pitch may be provided in portions of the heating element when it is desired to have those regions experience reduced heating. A method of fabricating such a heating element is also disclosed.

4 Claims, 3 Drawing Sheets

METHOD OF MANUFACTURE OF A NONUNIFORM HEATING ELEMENT

SUMMARY THE INVENTION

The present invention relates generally to electrically energized heating elements of the type which might, for example. be used to prevent the accumulation of frost in a refrigerator. and more particularly to techniques for fabricating such heating elements.

Resistance heating elements of this type are sometimes made by forming a resistance wire (NICHROME for example) in a helical pattern about a central string or core. The string with the wire wound about it is coated with an insulating material and then bonded to a support member such as a foil backing. Terminals are crimped to the two free ends and plug is molded about the two terminals. It is desirable to have very little heating effect in the leads which extend from the support member and frequently a small shorting wire is positioned within the insulating material laying across the turns of resistance wire shorting out the last few inches of the free ends so that no heating occurs near the plug.

The forgoing along with machinery for its manufacture is prior art in the technology of making heaters for automatic defrost refrigerators. In those applications where high heat and low heat regions are needed, the technique currently used is to splice different pieces of wire of different resistances together. With such a technique, the resistance wire is formed about the strand in a helical pattern of constant pitch, that is, the distance between adjacent turns is constant. In contradistinction, a variable pitch concept is employed in the present invention for those applications where high heat and low heat regions are needed. By winding the resistance wire about the string c strand with a controllable variable pitch so that significant heat will be generated where the turns are concentrated while little heat will be generated where those turns are spaced further apart, the shorting wire may be omitted and the need for splicing is eliminated.

The concept of a nonuniform winding has been employed in a number of dissimilar disciplines. The U.S. Pat. No. to Webster et al 2,918,642 shows two different ways of achieving nonlinear winding of resistance wire to form a nonlinear variable potentiometer. The Geominy U.S. Pat. Nos., 3,621,203 and 3,784,784 show multiple layer windings with cool spots where wires of different layers are in contact.

The Byce U.S. Pat. No. 1,110,532; Hyde U.S. Pat. No. 3,289,139; and Heuel et al U.S. Pat. No. 3,927,301 all show variable pitch winding of a resistance wire, but in each case to achieve uniform heating throughout the element. The Burger U.S. Pat. No. 1,491,194 is somewhat different from the others in using variable pitch to provide hot and cool areas along his element for the purpose of promoting air circulation.

Another group of U.S. patents employ variable pitch winding for connecting or termination purposes. Kane U.S. Pat. No. 3,538,374 winds a lamp filament with regions of pitch suitable for receiving support members. Beers U.S. Pat. No. 2,247,869 provides a region of coarse turns which is where the filaments are to be separated and that region straightened to form the filament leads. Geloso U.S. Pat. No. 1,763,772 discloses a clamp for tapping a wire wound resistor and provides sparse winding sections to promote more electrically accurate positioning of the tap.

A final group of U.S. patents including U.S. Pat. Nos. Graves 3,449,552; Herbert 3,593,002; Fessenden Re 26,522; and Dugger 3,538,482 address the problem of reducing heating in the leads to such a heating element, called "cold ending" by shorting the resistance wire turns where heat generation is undesirable.

Among the several objects of the present invention may be noted the provision of a cold end heating element without the usual shorting wire: the provision of a flexible variable pitch wound and uniform flexible resistance heating element; achieving the previous object by passing the strand of insulating material on which the heating element is being formed through a die to tension the strand axially and reduce a perpendicular strand dimension where the resistance wire is being placed; the provision of techniques for fabricating heating elements to selectively introduce reduced heat zones intermediate the element ends; the provision of winding techniques to provide cold end heating elements and improved termination: the provision of techniques for fabricating heating elements with variable density of turns of resistance wire; the provision of a technique for measuring the resistance of a heating element on the fly as the element is being formed; and the provision of a flexible nonuniform heating element of reduced cost and complexity.

These as well as other objects and advantageous features of the present invention will be in part apparent and in part pointed out hereinafter.

In general, a method of manufacturing a resistance heating element by forming a resistance wire about a flexible elongated strand of insulating material in a generally helical pattern includes moving the strand axially in its direction of elongation, paying out resistance wire in a circular motion about the strand as the strand moves to lay the resistance wire in a helical pattern about the strand and varying the relationship between the speed at which the strand is moved and the speed of the circular motion of the resistance wire to thereby vary the pitch of the helical pattern. The step of moving the strand may include a tensioning of the strand, as by pulling the strand through a die to reduce a strand dimension in a direction oblique to the direction of moving as the resistance wire is laid thereabout to thereby provide a more uniform and tight helical pattern about the strand when the tension is relaxed. Uniformity is achieved by controlling strand oscillations and accurately controlling the point at which wire meets the strand. The resistance of a predetermined length of the resistance heating element may be periodically measured by gripping the resistance heating element at two locations the predetermined length apart while the heating element moves in the direction of the strand axis and for a length of time sufficient to measure the resistance between the locations.

Also in general and in one form of the invention. a flexible elongated resistance heating element has a continuous strip of resistance wire formed about a flexible elongated strand of insulating material in a generally helical pattern of nonuniform pitch. The pitch of the helical resistance wire pattern varies as it approaches each of the ends of the element to provide, near each end, a region of increased pitch followed by a region of decreased pitch. An insulating coating surrounds the resistance wire and strand, and electrical terminals are connected to the regions of decreased pitch of the resistance wire at the ends. The heating element may be bonded to a support member in a serpentine pattern with the end regions of increased pitch and subsequent decrease extending freely from the support member. The helical pattern of resistance wire may include at least one intermediate region of increased pitch in a portion of the heating element which is bonded to the support member where reduced heating is required.

BRIEF DESCRIPTION OF THE DRAWING

Corresponding reference characters indicate corresponding parts throughout the several views of the drawing.

The exemplifications set out herein illustrate a preferred embodiment of the invention in one form thereof and such exemplifications are not to be construed as limiting the scope of the disclosure or the scope of the invention in any manner.

DESCRIPTION OF THE PREFERRED EMBODIMENT

Figure 1:
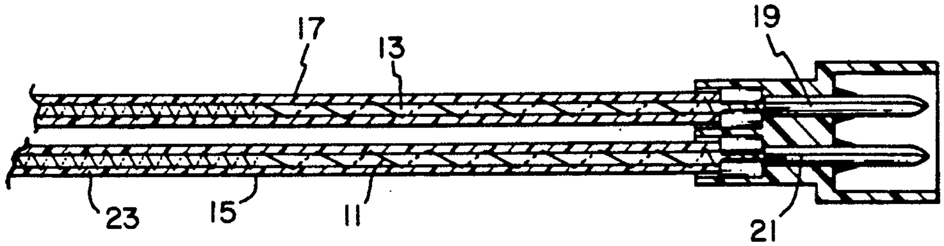
FIG. 1 is a view in cross-section of a portion of a resistance heating element illustrating the invention in one form.
Figure 2:
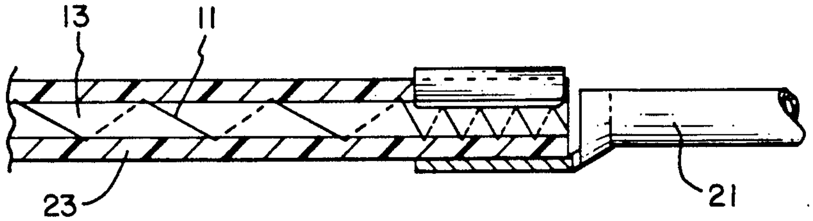
FIG. 2 is a view in cross-section of the heating element of FIG. 1 showing a crimp connection of an electrical terminal to one end.
Figure 3:
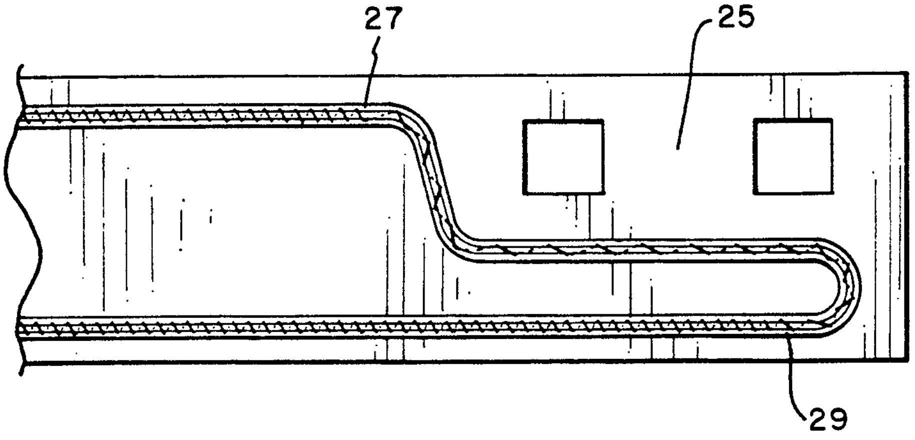
FIG. 3 illustrates another portion of the heating element of FIG. 1 bonded to a support member.

FIGS. 1-3 illustrate a flexible heating element made in accordance with the techniques of the present invention. The heating element is formed by winding the resistance wire 11 about the flexible string or strand 13 with a controllable variable pitch. A lot of heat will be generated where the turns are concentrated, for example, leftward from the points 15 and 17 in FIG. 1, while little heat will be generated where those turns are spaced further apart as from the points 15 and 17 rightwardly to the electrical contacts or terminals 19 and 21. As seen in FIG. 1 and 2, the last few inches near the ends of the heating element may be formed with widely spaced turns so as to effectively be a "cold end" with the turns again concentrated or closely spaced where the terminals 19 and 21 are crimped to the wire 11. The terminals 19 and 21 effectively short out those last turns while the turns are sufficiently concentrated to assure a good connection. Thus, the small solid shorting wire typical of prior art cold ending may be eliminated. Variable pitch to achieve the cold end and a few concentrated turns at the point of terminal attachment is best seen in FIG. 2.

The flexible elongated resistance heating element has a continuous strip of resistance wire 11 formed about the flexible elongated strand 13 of insulating material. The strand 13 may be asbestos, fiber glass. KEVLAR, or other suitable heat resistant flexible insulating material such as a polyester. The resistance wire 11 is wound in a generally helical pattern of nonuniform pitch with that pitch varying as the wire approaches each of the ends of the element to provide, near each end, a region of increased pitch followed by a region of decreased pitch. Thus, the region or interval to the right of point 15 has fewer turns per inch (increased pitch) until the crimp area is reached whereupon the number of turns per inch is significantly increased (decreased pitch) to provide for good contact with the terminals. An insulating coating 2$ surrounds the resistance wire and strand, which coating may be stripped off preparatory to crimping the electrical terminals to the regions of decreased pitch of the resistance wire at the ends, or insulation piercing terminals may be used at the terminal ends with no stripping of the insulating material.

The heating element may be bonded to the support member such as the foil backing 26 when the heating element is to be used, for example, in a refrigerator, with the end regions of increased pitch and subsequent decreased pitch as shown in FIG. 1 extending freely from the support member for connection to a source of power in the refrigerator. The heating element will typically be bonded to the support 25 in a serpentine pattern and in some cases, regions of reduced heating as between points 27 and 29 may be required. Thus, the helical pattern of resistance wire may include one or more intermediate regions of increased pitch (fewer turns per inch) in a portion of the heating element which is bond to the support member.

The pitch of a helix is the distance along a cylindrical surface between adjacent wires and is the reciprocal of the number of turns per unit length. Thus, an increased pitch corresponds to a decrease in the density or closeness of the turns. In a true helix, any abrupt or gradual change in pitch would constitute a new helix. As used herein, terms such as "helical pattern" are not restricted to a true helix of constant curvature and a constant angle tangent line, but rather, include all similar spiral and helix-like three dimensional curves with either constant or changing pitch.

Figure 4:
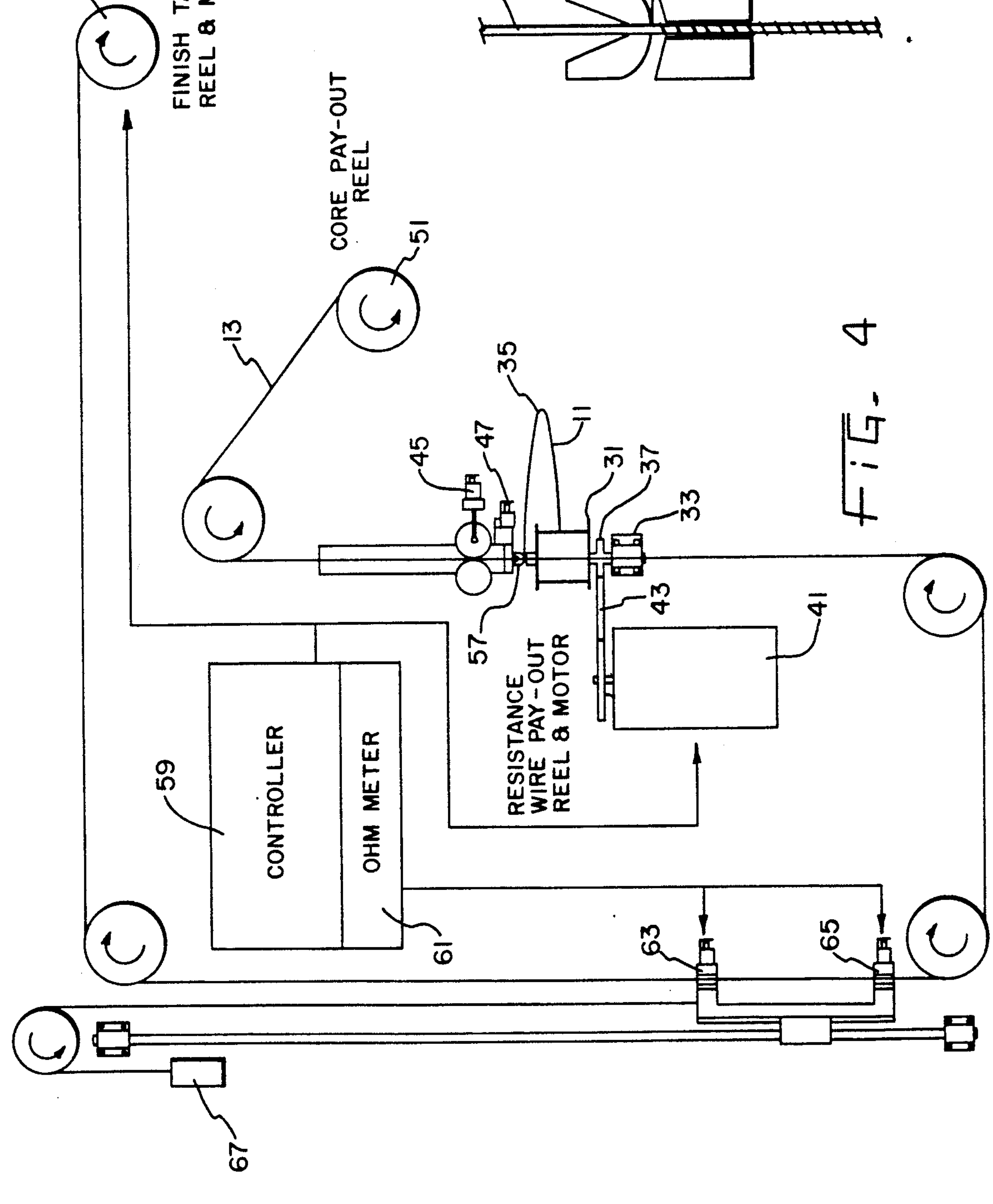
FIG. 4 is a somewhat schematic illustration of apparatus for forming resistance wire about a flexible strand.

A method of manufacturing a resistance heating element of FIGS. 1-3 is shown in FIGS. 4-7. Referring particularly to FIG. 4, the heating element is made by forming resistance wire 11 about flexible elongated strand 13 of insulating material in a generally helical pattern by moving the strand axially downwardly as viewed in its direction of elongation while paying out resistance wire in a circular motion about the strand as the strand moves. A resistance wire pay-out& reel 31 is driven by motor 41 by way of a V-belt or chain 43 which is entrained on a pulley or sprocket 37 which is fixed to the reel causing it to rotate about the strand axis. The wire forms a loop bowed outwardly as at 35 by centrifugal force as the loop revolves about the strand. The motion !s somewhat similar to the twirling of a lariat, however, wire is continuously payed out from the pay-out reel and taken up at the other end of the loop as the wire forms itself about the moving strand. The direction of rotation of the reel 31 is such as to tend to wind the wire onto the reel or spool and the combination of forces acting on the wire maintain a fairly constant loop length for a given reel speed. The combination of these two motions, which is known as served wire winding, is effective to lay the resistance wire in a helical pattern about the strand.

In FIG. 4, the resistance wire pay-out reel 31 is mounted onto a hollow shaft spindle which is, in turn, support&ed on bearing 33 in which the pay-out reel 31 and spindle are free to rotate. The spindle includes the sprocket 31 which is driven by motor 41 by way of V-belt 43, chain or similar coupling.

Solenoid 45 is effective to supply conductor material which shorts the resistance wire to form the cold ends of the finished heating element and this material is cut off by actuation of solenoid 47. As noted earlier, this piece of shorting wire is, in many cases, eliminated by the present invention.

Figure 5:
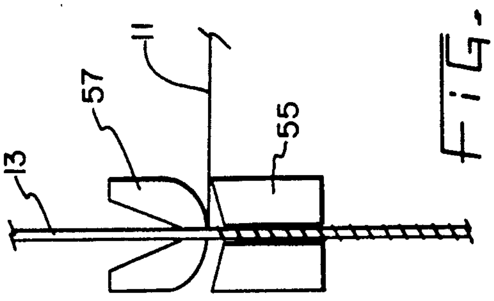
FIG. 5 is an enlarged view of the portion of FIG. 4 where the resistance wire and strand meet.

A spool 51 supplies strand material to the process while wire wound strand material is taken up by a motor driven reel 53. Any change in the relative speeds of motor 41 and the motor driving reel 53 will vary the relationship between the speed at which the strand is moved and the speed of the circular motion of the resistance wire and will thereby vary the pitch of the helical pattern. The length of strand 13 between the reels 51 and 53 may be maintained under tension by imposing a friction drag on reel 51 if desired. Strand tension may also be achieved by passing the strand through a restricted opening or die 57 as best seen in FIG. 5. Such tensioning of the strand will stretch the strand and reduce a transverse strand dimension in a direction oblique to the direction of strand movement. Thus, die 57 has an opening smaller than the normal cross-section of the strand and tends to squeeze the strand as the resistance wire is laid thereabout and, when the tension is removed and the strand resumes its normal shape. provides a more uniform and tight helical pattern about the strand. Guide 55 is positioned closely beneath die 57 and contributes in two ways to maintaining uniformity of the resistance wire turns. Guide 55 and die 57 minimize lateral strand motion, otherwise strand 13 may vibrate or oscillate like a guitar string during the winding process. The vertical separation between the die 57 and guide 55 between which the resistance wire passes is kept to a minimum to insure a constant location of the point where the moving strand and wire meet. The point at which the wire and strand join is thereby accurately controlled.

Since variations in spindle speed tend to change the force on (and the shape of) loop 35, typically, the speed of the circular motion of the spindle and reel 31 is held constant and the speed at which the strand is moved is either increased or decreased to vary the pitch of the helical pattern.

The speeds of the motors 51 and 55 are controlled by a computer control unit 59. This unit also receives input information from a bridge or other resistance monitor 61 which periodically samples the resistance of a predetermined length of the resistance heating element. A pair of solenoid actuated contacts 63 and 65 may be energized to grip the resistance heating element at two locations a predetermined length apart while the heating element moves along the axis and move with the strand in the direction of the strand axis for a length of time sufficient to measure the resistance between the locations. A counterbalance 67 minimizes strand stress during the resistance measurement.

Figure 6:
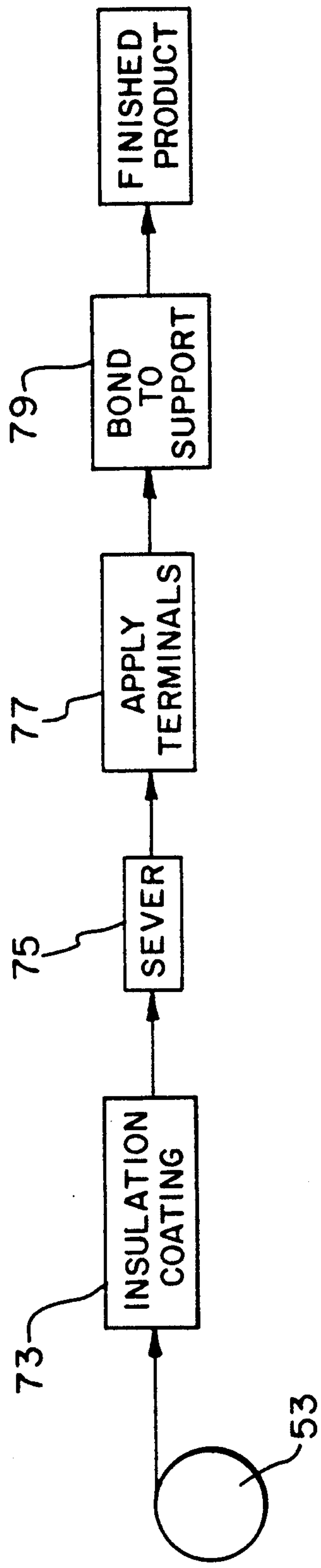
FIG. 6 is a flow chart showing the process of making the heating element of FIG. 1 commencing with the end product of FIG. 4.

An insulating coating may be applied to the strand after wrapping and prior to take-up reel 53, however, coating the resistance wire and strand with an electrically insulating material after the resistance wire is laid about the strand typically occurs during subsequent processing as shown schematically in FIG. 6.

Figure 7:
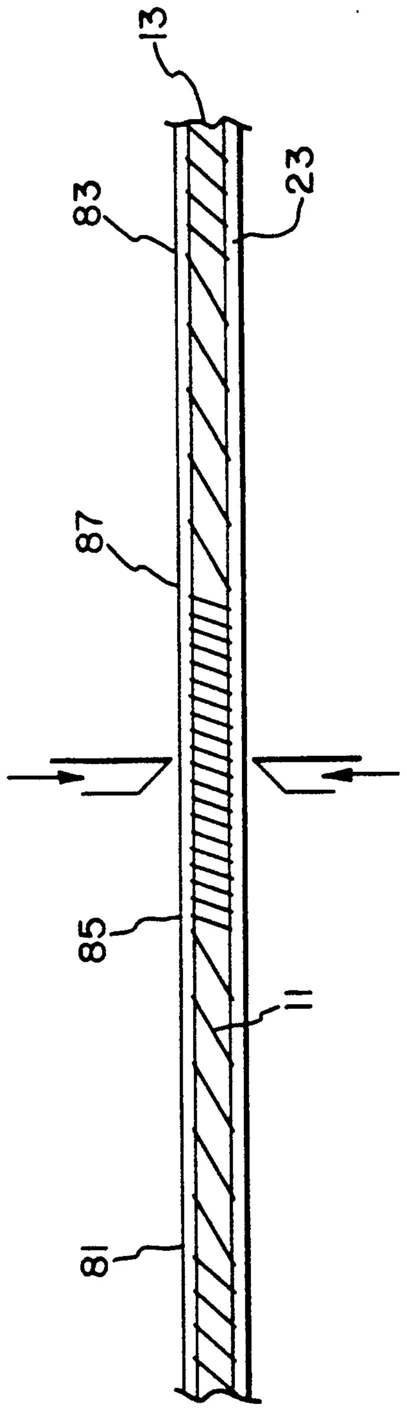
FIG. 7 illustrates the severing step of FIG. 6.

FIGS. 6 and 7 illustrate subsequent processing of a spool 53 of continuous wire wound strand material. The strand and wire are first coated with an insulating material at 73 by a dipping, extrusion or other conventional insulation coating technique. The coated strand and wire are then cut into individual heating element sections at 75. Each cut typically occurs midway along a section of high density (low pitch) turns as illustrated in FIG. 7 to provide at each end a dense wrap for receiving crimp terminals at 77. Thus, the severing of the coated resistance wire and strand at predetermined locations along the strand creates insulated resistance heating elements of a selected length. The terminals may be of the type which pierce the insulation to make contact with the wire or the severing step may be followed by stripping of a short section of insulation from the ends preparatory to termination. Finally. 79 illustrates the bonding of a selected length heating element to a support member 25 after providing electrical terminals connected to the resistance wire at respective ends of the heating element.

The illustrative section of heating element of FIG. 7 has a conventional pitch to the left of point 81 and to the right of point 83. There was a decrease in the speed of the strand motion relative to the speed of spindle 31 to reduce the pitch between points 85 and 87 to provide a more dense wrap around the predetermined location at which the strand and resistance wire are severed. The speed of the strand relative to the speed of the spindle was increased both prior and subsequent to this decrease to provide the regions of increased pitch between points 81 and 85, and between regions 87 and 83. Thus, the reduced pitch region where the elements are to be cut is bounded on either side by "cold" regions of increased pitch.

From the foregoing, it is now apparent that a novel heating element and technique for the fabrication thereof have been disclosed meeting the objects and advantageous features set out hereinbefore as well as others, and that numerous modifications as to the precise shapes, configurations and details may be made by those having ordinary skill in the art without departing from the spirit of the invention or the scope thereof as set out by the claims which follow.

What is claimed is:

1. A method of manufacturing a resistance heating element by forming a resistance wire about a flexible elongated strand of insulating material in a generally helical pattern comprising the steps of:

moving the strand axially in its direction of elongation, the step of moving including tensioning the strand by pulling the strand through a die having an opening smaller than the normal cross-section of the strand to reduce a strand dimension in a direction perpendicular to the direction of moving as the resistance wire is laid thereabout and to provide a more uniform and tight helical pattern about the strand;

paying out resistance wire in a circular motion about the strand as the strand moves to lay the resistance wire in a helical pattern about the strand;

controlling the location at which the strand and resistance wire join to insure uniformity of the turns of wire about the strand; and varying the relationship between the speed at which the strand is moved and the speed of the circular motion of the resistance wire to thereby vary the pitch of the helical pattern.

2. A method of manufacturing a resistance heating element by forming a resistance wire about a flexible elongated strand of insulating material in a generally helical pattern comprising the steps of:

moving the strand axially in its direction of elongation;

paying out resistance wire in a circular motion about the strand as the stand moves to lay the resistance wire in a helical pattern about the strand; and measuring the resistance of a predetermined length of the resistance heating element by gripping the resistance heating element at two locations the predetermined length apart while the heating element moves with the strand along the axis thereof and for a length of time sufficient to measure the resistance between the locations.

3. A method of manufacturing a resistance heating element by forming a resistance wire about a flexible elongated strand of insulating material in a generally helical pattern comprising the steps of:

moving the strand axially in its direction of elongation;

paying out resistance wire in a circular motion about the strand as the strand moves to lay the resistance wire in a helical pattern about the strand;

the step of moving the strand including the step of tensioning the strand to reduce a strand dimension in a direction perpendicular to the direction of moving as the resistance wire is laid thereabout by pulling the strand through a die having an opening smaller than the normal cross-section of the strand to thereby provide a more uniform and tight helical pattern about the strand.

4. A method of manufacturing a resistance heating element by forming a resistance wire about a flexible elongated strand of insulating material in a generally helical pattern comprising the steps of:

moving the strand axially in its direction of elongation;

paying out resistance wire in a circular motion about the strand as the strand moves to lay the resistance wire in a helical pattern about the strand;

controlling the location at which the strand and resistance wire join to insure uniformity of the turns of wire about the strand;

varying the relationship between the speed at which the strand is moved along its axis and the speed of the circular motion of the resistance wire about that axis to thereby vary the pitch of the helical pattern; and measuring the resistance of a predetermined length of the resistance heating element by gripping the resistance heating element at two locations the predetermined length apart while the heating element moves along the axis and for a length of time sufficient to measure the resistance between the locations.

* * * * *